United States Patent
Felten

(10) Patent No.: US 6,317,023 B1
(45) Date of Patent: Nov. 13, 2001

(54) METHOD TO EMBED PASSIVE COMPONENTS

(75) Inventor: John James Felten, Chapel Hill, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/419,681

(22) Filed: Oct. 15, 1999

(51) Int. Cl.[7] ................................................ H01C 1/02
(52) U.S. Cl. ..................... 338/254; 338/309; 338/320; 29/620; 174/259; 427/96; 427/103
(58) Field of Search .................................. 338/252, 253, 338/254, 309, 320; 29/620; 427/96, 103; 174/259, 260

(56) References Cited

U.S. PATENT DOCUMENTS

| | | | |
|---|---|---|---|
| 4,180,608 | * 12/1979 | Del ........................................ | 428/196 |
| 4,204,187 | * 5/1980 | Kakuhashi et al. ................... | 338/307 |
| 4,724,040 | * 2/1988 | Iwasa ..................................... | 216/16 |
| 5,263,243 | 11/1993 | Taneda et al. ......................... | 29/830 |
| 5,473,118 | * 12/1995 | Fukutake et al. ..................... | 174/258 |
| 5,557,843 | * 9/1996 | McKenney et al. .................. | 29/851 |
| 5,652,055 | * 7/1997 | King et al. ............................ | 428/343 |
| 5,781,100 | * 7/1998 | Komatsu ................................ | 338/252 |

FOREIGN PATENT DOCUMENTS

| | | | |
|---|---|---|---|
| 0 859 705 A1 | 10/1998 | (EP) | ................................ H05K/3/46 |
| 2-153589 | 6/1990 | (JP) | ................................ H05K/1/16 |
| 98/39784 | 9/1998 | (WO) | ............................. H01G/4/06 |

* cited by examiner

Primary Examiner—Karl D. Easthom

(57) ABSTRACT

The invention is directed to a method of embedding thick film passive components on an organic substrate wherein a flexible metallic substrate has a conductive paste underprint applied thereon. The method comprises the following steps: applying a conductor paste underprint onto a flexible metallic substrate; firing the preceding article; applying at least one passive component paste onto the underprint; firing the preceding article; and applying the passive component side of the metallic substrate onto at least one side of an organic layer which is at least partially coated with an adhesive layer wherein the passive component side of the article is embedded into the adhesive layer.

10 Claims, 2 Drawing Sheets

METHOD TO EMBED PASSIVE COMPONENTS

FIELD OF THE INVENTION

The present invention is directed to an improved method of embedding thick film passive components on an organic layer wherein a flexible metallic substrate has a conductive paste underprint applied thereon.

BACKGROUND OF THE INVENTION

Passive components today consist of a carrier with built in passive compositions usually derived from resistor or capacitor thick film technology and terminated by metal conductors. The components are mounted onto a printed wiring board (PWB) surface one at a time with pick and place equipment, and connected electrically to the circuit by one of several complex processes involving adhesives, fluxes, solder paste, and/or wave soldering or reflow.

As the demand for miniaturizing electronic devices increases, both circuit density and the density of components per unit area have dramatically increased.

The number of components has risen exponentially necessitating the shrinking of component size. Since the design of smaller, denser boards is approaching the practical limit for today's technology, circuit designers have maximized real-estate and cannot add components unless they become much smaller, or as an alternative, buried within the inner layers, i.e., vertical stacking of components.

Early versions of the embedded passive panels, as found in Japanese patent application kokoku H2-153589, had the passive components printed directly onto a metal foil. This method had drawbacks, such as adhesion problems with the resistors and low capacitance and high dissipation factor with the capacitors. The present invention achieves success with adhesion by the application of a paste underprint that was applied to the metal foil before the printing of the passive components. Therefore, the present invention utilizes an improved method of forming passive components using present cermet thick film technology for low cost embedded component formation on organic substrates.

SUMMARY OF THE INVENTION

The present invention is directed to a method of embedding thick film passive components comprising the following steps:

A. applying as an underprint a conductor paste onto a flexible metallic substrate;
B. firing the article found in step A.;
C. applying at least one resistor paste onto the underprint;
D. firing the article found in step C.;
E. applying the fired paste side of the article found in step D. onto at least one side of an organic layer which is at least partially coated with an adhesive layer wherein the fired paste side of the article is embedded into the adhesive layer.

The present invention is further directed to a method of embedding thick film passive components comprising the following steps:

A. applying as an underprint a first conductor paste onto a flexible metallic substrate;
B. firing the article found in step A.;
C. applying at least one dielectric paste onto the underprint;
D. firing the article found in step C.;
E. applying a second conductor paste onto the fired pastes;
F. firing the article found in step E.;
G. applying the fired paste side of the article found in step F. onto at least one side of an organic layer which is at least partially coated with an adhesive layer wherein the fired paste side of the article is embedded into the adhesive layer.

Employing conventional print/etch processing to pattern the conductors may then complete the above methods.

Resistor and capacitor pastes can in principle be printed together, as well as multiple grades of resistor paste and multiple grades of capacitor pastes, as long as all pastes use the same furnace profile in the firing step.

DETAILED DESCRIPTION OF THE INVENTION

Figure 1A:
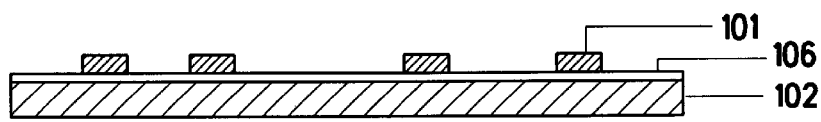
FIG. 1 is an illustration of a buried passive component fabricated in accordance with the present invention method.

The present invention is an improved process that permits existing ceramic thick film technology to be utilized in forming buried passive components such as resistors and capacitors on organic PWBs and other organic layers. The improved process utilizes paste, which forms an underprint that is applied to the metal foil before printing the passive components. The term "paste" is conventional language used in the electronic materials industry, which refers to a thick film composition. The underprint greatly enhances adhesion. It was found that the underprint adhered well to the metal foil and the organic layer. Typically, the metal found in the underprint would be matched to the metal found in the metal foil. For example, if a copper foil were used then a copper paste would be utilized as an underprint. Examples of other applications would be pairing silver, gold and nickel foils with a similar metal paste, which would be used as an underprint.

The preferred system is a copper foil paired with a copper paste used as an underprint. The copper paste may be printed as an open coating over the entire surface of the foil or printed on selected areas, which is the more economical approach. Areas can also be selected through a printing and etching process. When copper foil is used, an advantage of coating the entire surface of the foil is that the glass in the copper paste retards oxidative corrosion of the copper foil when an oxygen doped firing atmosphere is used.

Silver foil is an alternative to copper foil. Silver foil has the advantage that air fired resistors with superior electrical properties can be used, since silver is stable in air firing. Militating against silver is its cost and its propensity to migrate, and the non-industry-standard etching chemistry needed.

Embodiments of the claimed processes will be described in detail using silver paste as a first metal termination and a gold paste as a second metal termination. The metals of silver and gold are used for illustrative purposes and in no way limit the invention to the mentioned metals. A silver paste underprint is applied to silver foil then dried and fired under the melting point of the silver foil. A resistor paste is patterned by screen printing onto the underprinted foil, then dried and fired, typically at 850° C. which is below the melting point of the silver. The fired resistors/foil are then inverted and laminated to an organic layer such as a printed wiring board (PWB) which is composed at least partly of one or more layers of adhesive, so that the resistors sink into the adhesive to make a flat surface suitable for etching terminations. A photoresist such as Riston® made by E. I. du Pont de Nemours and Company is then laminated onto the silver foil; the photoresist is then exposed to UV light to generate a pattern of the resistors and silver terminations and optionally other circuit traces.

The exposed photoresist is then developed, and the silver thus exposed is etched using cyanide, aqua regia, or other suitable etchant to produce the resistor terminations (and, optionally, circuit traces); the photoresist is then stripped, leaving the desired circuit. Optionally, the circuit may then be encapsulated, for example, with a curable epoxy encapsulant.

If capacitors are being added to the resistor build, before firing of the resistor paste and before lamination to the PWB, at least one layer of dielectric paste (usually high K dielectric which is air fireable) is patterned and printed onto the resistor paste which allows locating the dielectric (capacitor) in the same plane as the resistor paste. The dielectric paste is then dried and co-fired with the resistor. A second electrode material (e.g., gold paste) is then printed on top of the fired dielectric pattern and patterned so that it comes off one side of the dielectric pattern onto the silver underprint and possibly the silver foil (if the underprint was applied in a pattern) forming a more complex build. The build is then fired at a low temperature (<400° C.) to sinter the second electrode onto the silver underprint and/or foil which formed a first electrode but not at a temperature low enough to prevent the silver underprint and/or foil and gold print from diffusing into each other. Alternatively, a thermoset thick film silver paste can be used for a second electrode wherein the thick film silver paste would be cured instead of fired.

The silver foil containing the fired capacitors and resistors are then inverted so that, upon laminating, the passive components are embedded into the adhesive layer on a PWB. A photoresist is then laminated onto the silver foil; exposed with a pattern that defines the electrodes and terminations. The top electrode for the capacitor must be composed of a metal that is not etched by the etchant for the silver; thus, the silver electrode and both terminations may be formed during the print-and-etch process. The top electrode was previously screen printed as described above.

By proper sequencing of materials that need different firing conditions, or matching of compatible resistor and capacitor pastes a process with the same firing profile, a single layer containing both resistors and capacitors may be made.

If capacitors were being used without resistors then the steps introducing the resistor layer would be eliminated from the description above.

FIG. 1 depicts the most general embodiment of the present invention and is described in detail hereinbelow:

FIG. 1a—thick film resistors or capacitors known as passive components (101) are printed onto a conductive paste underprint (106) which is applied on a metallic foil (102) and then fired below the softening point of the metallic foil.

Figure 1B:
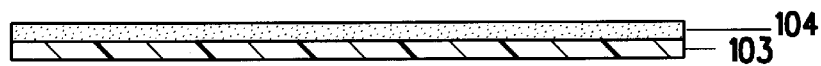

FIG. 1b—a printed wiring board (PWB) (103) with an adhesive layer (104) coated on one side.

Figure 1C:
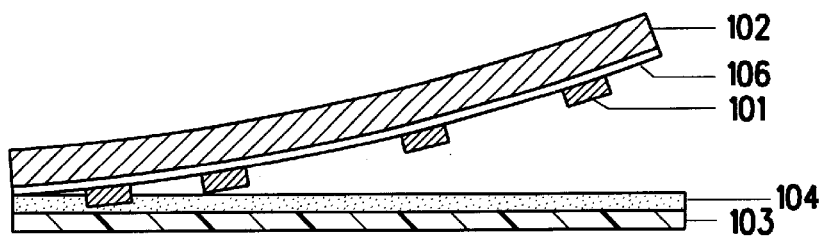

FIG. 1c—the printed side of the fired metallic foil and the adhesive layer side of the PWB are laminated together.

Figure 1D:
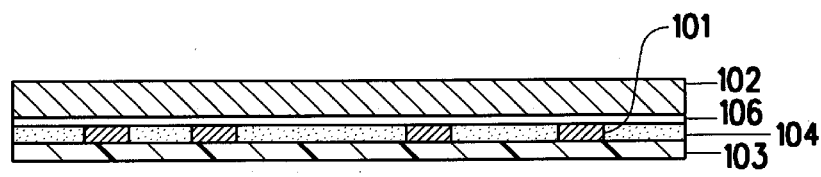

FIG. 1d—the passive components are laminated in an inward direction, that is, they are embedded into the adhesive layer during the lamination process. This yields a relatively flat plane for the application of a photosensitive film.

Figure 1E:
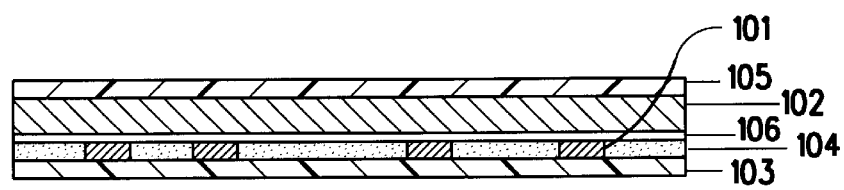

FIG. 1e—a photosensitive film is then laminated onto the metallic foil.

Figure 1F:
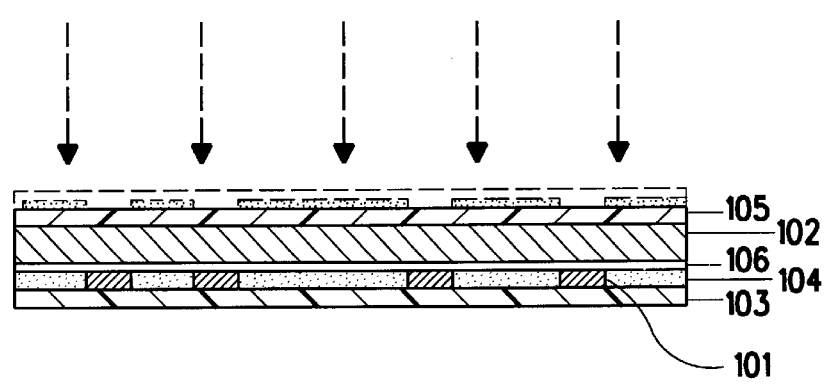

FIG. 1f—the film is imagewise exposed to actinic radiation to define areas, which have been exposed.

Figure 1G:
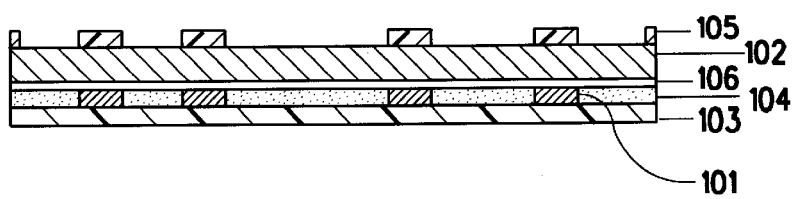

FIG. 1g—development is achieved by removal of the unexposed areas of the film, which leaves metallic foil exposed.

Figure 1H:
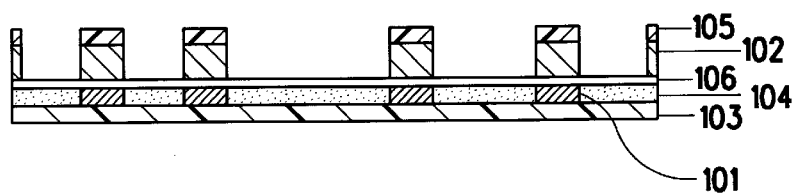

FIG. 1h—the metallic foil is then etched.

Figure 1I:
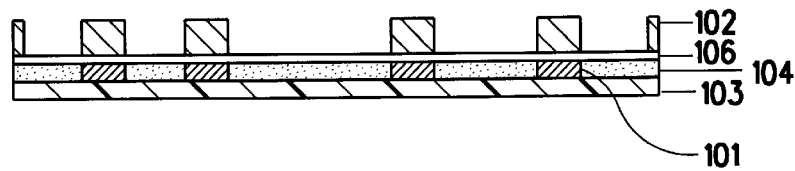

FIG. 1i—the circuit and the passive components are actualized in the same plane.

The above process may, as referred to above, apply to double-sided builds.

The main components of the invention are described hereinbelow:

Foils

The metallic foils are those available in the industry. The preferred foils are copper, silver, gold, aluminum, nickel or iron foil with a thickness of about 0.01–100$\mu$, preferably 2–75$\mu$ and most preferably 15–40$\mu$.

Thick Film Composition

The thick film compositions known as pastes are utilized as the underprint and as the passive components. The resistor compositions are commercially available with $RuO_2$, $LaB_4$, $SnO_2$, or TaN based thick film resistor pastes being preferred. The capacitor thick film compositions are commercially available with the barium titanate or titanium oxide thick film paste being preferred. Generally, thick film pastes are comprised of finely divided particles of glass, metal or other special function type particles (referred to as "solids") dispersed in polymers dissolved in a mixture of plasticizer, dispersing agent and organic solvent. The preferred pastes for the passive components are resistor pastes, which are well known in the industry, and commercially available although some blending may be needed to achieve desired resistances. The capacitor pastes are also commercially available but the preferred pastes which are printed on a copper system have an organic vehicle that exhibits good burn-out in a nitrogen atmosphere and an oxidizing component such as barium nitrate powder blended into the dielectric powder mixture.

The solids are mixed with an essentially inert liquid medium (vehicle) by mechanical mixing using a planetary mixer, then dispersed on a three roll mill to form a paste-like composition having suitable consistency and rheology for screen printing. The latter is printed as a "thick film" on conventional ceramic substrates in the conventional manner.

Any essentially inert liquid may be used as the vehicle. Various organic liquids, with or without thickening and/or stabilizing agents and/or other common additives, may be used as the vehicle. Examples of organic liquids which can be used are the aliphatic alcohols, esters of such alcohols, for example, acetates and propionate, terpenes such as pine oil, terpineol and the like, solutions of resins such as the polymethacrylates of lower alcohols, solutions of ethyl cellulose in solvents such as pine oil and the monobutyl ether of ethylene glycol monoacetate and dibutyl carbitol. A preferred vehicle is based on ethyl cellulose resin and a solvent of texanol, a proprietary ester/alcohol from Eastman Chemicals (see Examples); alternatively, alpha-, beta-, and gamma terpineols (generally 85–92% alpha-terpineol containing 8–15% beta- and gamma-terpineols) also have superior properties when used as solvent for thick film inks, although poorer burnout properties than the texanol. The vehicle also may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage, the dispersions will contain complementarily 50–91% solids and 50–9% vehicle, as described above. The compositions of the present invention may, of course, be modified by the addition of other materials, which do not affect its beneficial characteristics. Such formulations are well within the state of the art.

The pastes are conveniently prepared on a three-roll mill. The viscosity of the pastes is typically within the following ranges when measured on a Brookfield HBT viscometer at low, moderate and high shear rates:

| Shear Rate (sec$^{-1}$) | Viscosity (Pa *s) | |
| --- | --- | --- |
| 0.2 | 100–5000 | |
| | 300–2000 | Preferred |
| | 600–1500 | Most Preferred |
| 4 | 40–400 | |
| | 100–250 | Preferred |
| | 120–200 | Most Preferred |
| 40 | 10–150 | |
| | 25–120 | Preferred |
| | 50–100 | Most Preferred |

Organic Layer

The preferred organic layers used in this invention are the types of boards utilized in the printed-circuit board industry. Generally, they are made from high-pressure laminates. By definition, a laminate consists of layers of fibrous materials bonded together under heat and pressure with a thermosetting resin. Many times it is an electrical-grade paper bonded with phenolic or epoxy resin or a continuous-filament glass cloth bonded with an epoxy-resin system. More specifically, examples are:

XXXPC made from a high-quality electrical paper impregnated with a phenolic resin;

FR-2 similar to Grade XXXPC except a flame-retardant property;

FR-3 is self-extinguishing paper epoxy;

G-10 is a high-quality laminate made from sheets of glass cloth bonded with epoxy resin;

FR-4 is quite similar to G-10 except for the added self-extinguishing property. G-11 is a glass-cloth-epoxy; currently, FR-4 is a preferred substrate material for many applications.

FR-5 is the flame-resistant modification of G-11.

Adhesives

The adhesives should be electrically insulating. An epoxy, resin, acrylic or ceramic type adhesive may be used. The preferred thickness of the adhesive applied is about 0.04 to about 0.2 millimeters. The preferred adhesives are commercially available Vialux®, Pyralux® and Pyralux WA®.

The present invention will be described in further detail by giving practical examples. The scope of the invention, however, is not limited in any way by these practical examples.

EXAMPLES

All values in the following examples are given in weight % based on total composition.

Compositions

The composition of the copper paste underprint follows:

| | |
| --- | --- |
| Texanol | 15.00% |
| Ethyl Cellulose | 0.75% |
| Glass A | 0.60% |
| Copper | 83.50% |
| Phosphate Wetting Agent | 0.15% |

Composition of Glass A:

| | |
| --- | --- |
| Silica | 9.4% |
| $B_2O_3$ | 12.2% |
| Lead Oxide | 65.9% |
| Cadmium Oxide | 6.7% |
| Sodium Fluoride | 3.2% |
| Aluminum Oxide | 0.2% |

The paste was prepared by techniques well known to those skilled in the art of thick film paste formulation and production. The glass was melted and fritted using standard techniques well known to those skilled in the art of glass production. Screen-printing was accomplished using standard screens (stainless steel mesh, 325 to 500 mesh screens). Thickness of the fired films on the copper foil was less than 10 microns, typically 8 to 9 microns.

| ENCAPSULANT PASTE | |
| --- | --- |
| Ingredient | Per Cent |
| Alumina Powder (Bayer Process, ~2 micron) | 55.0% |
| Solvent (dibutyl carbitol) | 16.0% |
| Resin (bisphenol-F. Shell #862) | 25.3% |
| Cyanoguanidine (Dyhard 100SF, SKW Trostberg) | 2.4% |
| Thermal Initiator (UR-150, SKW Trostberg) (Toluene2,4-bis(N,N-dimethylcarbamine)) | 1.3% |

The material was mixed in a high shear high-speed mixer such as a Cowles, commonly used in the paint industry. The alumina was adequately dispersed in this manner, and no additional roll milling was used.

Process Flow

The processes for parts with and without the adhesive layer are very similar. Examples 1–6 are comparative and demonstrated without a copper paste underprint. Examples 7–12 exemplify the invention and are demonstrated with a copper paste underprint. The parts were printed using a 230–280 mesh screen; dried at 80° C.; and fired on a nominal "30 minute" furnace profile (ten minutes peak at 900 degrees, with burnout ramp up to 20 minutes). Another 25 minutes is spent in unheated zones for a total residence time of 55 minutes in the tunnel kiln.

| Without Copper Paste Underprint | With Copper Paste Underprint |
|---|---|
| 1. No underprint layer | 1. Screen Print/Dry Copper Underprint Layer |
| 2. No firing | 2. Fire Copper Underprint Layer |
| 3. Print/Dry Resistor Paste | 3. Print/Dry Resistor Paste |
| 4. Fire Resistor Paste | 4. Fire Resistor Paste |
| 5. Vacuum Laminate Fired Parts of PWB which is coated on the converging side with Pryalux Adhesive | 5. Vacuum Laminate Fired Parts to PWB which is coated on the converging side with Pyralux Adhesive |
| 6. Microetch to Accept Riston | 6. Microetch to Accept Riston |
| 7. Laminate Riston | 7. Laminate Riston |
| 8. Expose Conductor Pattern on Riston | 8. Expose Conductor Pattern on Riston |
| 9. Develop/etch/strip boards | 9. Develop/etch/strip boards |
| 10. Print a curable epoxy encapsulant over the patterned resistors | 10. Print a curable epoxy encapsulant over the patterned resistors |

Results
Resistors Printed without Cu Paste Underprint - 10 Kohm, R, Average, and CV
10,000 Ohm Lanthanum boride resistor paste printed with Screen- Using Pyralux Adhesive

| Ex. 1 | Ex. 2 | Ex. 3 | Ex. 4 | Ex. 5 | Ex. 6 | |
|---|---|---|---|---|---|---|
| 26.65 | 27.92 | 20.57 | Open | 19.87 | Open | RESISTOR |
| 27.58 | 22.16 | 21.44 | 20.69 | 20.93 | 22.16 | VALUES |
| 26.91 | 152.8* | 22.62 | 29.45 | 24.1 | 28.9 | |
| 33.73 | 28.11 | 25.76 | 24.82 | 28.8 | 26.3 | |
| 31.58 | 38.2 | 26.4 | 36.8 | 28.1 | 34.2 | |
| 32.6 | 36.7 | 27.62 | 32.5 | 31.06 | 34.3 | |
| 33.5 | 27.31 | 476* | 27.27 | 31.6 | 32.2 | |
| 31.3 | 27.76 | 710* | 32.5 | 33.1 | 34.1 | |
| 30.48125 | 29.73714 | 24.06833 | 29.14714 | 27.195 | 30.30857 | Average |
| 2.973298 | 5.675446 | 2.903683 | 5.399265 | 5.001303 | 4.716621 | Standard Deviation |

Resistors with Underprint of Cu Paste - 10 kOhm, Resistance, Ave. and CV (20 × 20 resistors)

| Ex. 7 | Ex. 8 | Ex. 9 | Ex. 10 | Ex. 11 | Ex. 12 | |
|---|---|---|---|---|---|---|
| 24.3 | 21.1 | 21.9 | 17.9 | 22.3 | 20.9 | RESISTOR |
| Open | 21.1 | 21.9 | 18.5 | 21 | 21.5 | VALUES |
| 20.8 | 21.3 | 19.7 | 19.1 | 19 | 21.5 | |
| 21.4 | 21 | 19.4 | 19.4 | 17.3 | 21.2 | |
| 22.8 | 20 | 21.8 | 22.4 | 13.8 | 20.5 | |
| 22.7 | 22 | 21.4 | 21.1 | 15.5 | 21 | |
| 20.9 | 21 | 20.8 | 17.4 | 17.1 | 21.6 | |
| 17.6 | 17.6 | 19.6 | 15.9 | 20.1 | 19.7 | |
| 22.15 | 21.07143 | 20.98571 | 19.4 | 18 | 21.17143 | Average |
| 1.363452 | 0.587975 | 1.0574 | 1.781385 | 2.991098 | 0.398808 | Standard Deviation |

In the above tables, values marked with an asterisk are taken from resistors with an obviously damaged termination contacts. The non-underprinted boards (Examples 1–6) had undesirable values caused by poor termination adhesion. The performance of the resistors processed without the underprint layer was poorer in other respects as well. In the first place, the high ohm resistors had very poor adhesion to the copper. This manifested itself during handling, when random resistors would pop off of the copper foil during the process. The poor adhesion also caused higher variance of resistance in the resistors without the Cu underprint, as well as higher dissipation factors in capacitors in Example 13.

Example 13

The dielectric paste was printed onto a copper foil with an underprint, using two print/dry/fire sequences to lay down two dielectric layers, to minimize the effect of any pinholes. The parts were printed using a 400 mesh screen; dried at 80° C.; and fired on a nominal "30 minute" furnace profile (ten minutes peak at 900 degrees, with burnout ramp up to 20 minutes). Another 25 minutes is spent in unheated zones for a total residence time of 55 minutes in the tunnel kiln.

After the dielectrics are printed and fired on the underprinted copper foil, a low temperature silver paste is printed on the dielectrics, with a lead extending off the edge of the dielectric material. Since the copper does not affect the silver lead etch, it can be accessed after etching the copper off of it. The silver paste is fired in a furnace for ten minutes at 200° C. After firing, the material is ready to laminate, print, and etch. Usually, a copper pad is left on top of part of the silver lead to provide an attachment point.

The composition for the dielectric paste is:

| | |
|---|---|
| Zicronium Oxide Powder | 4.10% |
| Glass "A" | 6.10% |
| Ethyl Cellulose | 0.83% |
| Eastman Texanol | 17.63% |
| Barium Titanate Powder | 69.20% |
| Barium Nitrate Powder | 0.84% |
| Phosphate Wetting Agent | 0.40% |

Glass "A" is composed of:

| | |
|---|---|
| Germanium Oxide | 21.5% |
| Lead Tetraoxide | 78.5% |

Texanol is a proprietary ester/alcohol from Eastman; the ethyl cellulose is grade "T-200" from Hercules; and the phosphate wetting agent is tridecyl phosphate from AKZO. Powders are ground by processes familiar to those skilled in the art of formulation of thick film inks; the glass is also prepared using commonly used procedures. Organic and inorganic portions of the formula are mixed and roll milled to produce a thick film printing ink of viscosity suitable for screen-printing.

The composition of the silver paste is as follows:

| | |
|---|---|
| 5 micron flake silver | 48.2% |
| 1-2 micron silver | 26.8% |
| 0.6 to 0.8 micron silver | 3.6% |
| Ethyl Cellulose resin | 1.4% |
| Texanol | 20.0% |

The ethyl cellulose is T-200 grade, from Hercules; the Texanol is an alcohol/ester solvent from Eastman. Silver paste was prepared using techniques well known to formulators skilled in thick film art.

The parts thus prepared were inverted, laminated, coated with photoresist, and exposed, developed, etched and stripped using processes well known to those skilled in the art of PWB fabrication.

The following represent the electrical properties of capacitors made with these materials:

Capacitance is ~150 $nF/in^2$; std dev is <10%

Df is ~0.9 to ~1.7% from 1 KHz to 100 KHz

IR is >$5 \times 10^9$ Ohms

Breakdown voltage is ~300 v

What is claimed is:

1. A method of embedding thick film passive components comprising the following steps:

A. applying as an underprint a conductor paste onto a flexible metallic substrate;

B. firing the article found in step A.;

C. applying at leas. one resistor paste onto the underprint;

D. firing the article found in step C.;

E. applying the fired paste side of the article found in step D. onto at least one side of an organic layer which is at least partially coated with an adhesive layer wherein the fired paste side of the article is embedded into the adhesive layer.

2. A method of embedding thick film passive components comprising the following steps:

A. applying as an underprint a first conductor paste onto a flexible metallic substrate;

B. firing the article found in step A.;

C. applying at least one dielectric paste onto the underprint;

D. firing the article found in step C.;

E. applying a second conductor paste onto the fired pastes;

F. firing the article found in step E.;

G. applying the fired paste side of the article found in step F. onto at least one side of an organic layer which is at least partially coated with an adhesive layer wherein the fired paste side of the article is embedded into the adhesive layer.

3. A method of embedding thick film passive components comprising the following sequential steps:

A. applying as an underprint a first conductor paste onto a flexible metallic substrate;

B. firing the article found in step A;

C. applying at least one dielectric paste onto the underprint;

D. firing the article found in step C.;

E. applying a thermoset thick film conductor onto the fired pastes;

F. curing the article found in step E.;

G. applying the cured paste side of the article found in step F. onto at least one side of an organic layer which is at least partially coated with an adhesive layer wherein the cured paste side of the article is embedded into the adhesive layer.

4. The method of claim 2 or 3 wherein the step of applying at least one dielectric paste further comprises applying at least one resistor paste onto the underprint.

5. The method of claim 2 or 3 wherein the step of applying at least one dielectric paste further comprises applying at least one resistor paste onto the dielectric paste.

6. The method according to either of claim 1, 2 or 3 wherein the firing steps are performed below the softening or melting point of the metallic substrate.

7. The method of claim 1, 2 or 3 further comprises an encapsulant.

8. The method of claims 1, 2 or 3 wherein the underprint is a conductor paste comprising the same type of metal as found in the metallic substrate.

9. The method of claim 2 or 3 wherein the dielectric paste contains an oxidizing agent.

10. A buried passive component formed in accordance with the method of claim 1, 2 or 3.

* * * * *

UNITED STATES PATENT AND TRADEMARK OFFICE
CERTIFICATE OF CORRECTION

PATENT NO.   : 6,317,023 B1
DATED        : November 13, 2001
INVENTOR(S)  : Felten, John J.

It is certified that error appears in the above-identified patent and that said Letters Patent is hereby corrected as shown below:

Title page,
Item [56], References Cited, FOREIGN PATENT DOCUMENTS, "0 859 705 A1" should read -- 0 869 705 A1 --.

Column 10,
Line 36, "leas" should read -- least --.

Signed and Sealed this

Fifth Day of August, 2003

JAMES E. ROGAN
*Director of the United States Patent and Trademark Office*